United States Patent
Abhinand et al.

(10) Patent No.: US 11,275,300 B2
(45) Date of Patent: Mar. 15, 2022

(54) EXTREME ULTRAVIOLET MASK BLANK DEFECT REDUCTION

(71) Applicant: Applied Materials, Inc., Santa Clara, CA (US)

(72) Inventors: Sai Abhinand, Singapore (SG); Shuwei Liu, Singapore (SG); Hui Ni Grace Fong, Singapore (SG); Ke Chang, Sunnyvale, CA (US); Vibhu Jindal, Milpitas, CA (US)

(73) Assignee: Applied Materials Inc., Santa Clara, CA (US)

( * ) Notice: Subject to any disclaimer, the term of this patent is extended or adjusted under 35 U.S.C. 154(b) by 249 days.

(21) Appl. No.: 16/502,749

(22) Filed: Jul. 3, 2019

(65) Prior Publication Data

US 2020/0012183 A1    Jan. 9, 2020

Related U.S. Application Data

(60) Provisional application No. 62/694,744, filed on Jul. 6, 2018.

(51) Int. Cl.
   *G03F 1/22*         (2012.01)
   *G03F 1/24*         (2012.01)

(52) U.S. Cl.
   CPC . *G03F 1/22* (2013.01); *G03F 1/24* (2013.01)

(58) Field of Classification Search
   CPC ..................................... G03F 1/22; G03F 1/24
   USPC ........................................................... 430/5
   See application file for complete search history.

(56) References Cited

U.S. PATENT DOCUMENTS

| | | | |
|---|---|---|---|
| 6,132,566 A | 10/2000 | Hofmann et al. | |
| 6,396,900 B1 | 5/2002 | Barbee, Jr. et al. | |
| 6,589,398 B1 | 7/2003 | Lu et al. | |
| 6,606,199 B2 | 8/2003 | Wang | |
| 2003/0019739 A1 | 1/2003 | Shibamoto et al. | |
| 2005/0133365 A1 | 6/2005 | Hong et al. | |
| 2005/0186485 A1 | 8/2005 | Yoshikawa et al. | |
| 2006/0231388 A1 | 10/2006 | Mullapudi et al. | |
| 2010/0027107 A1 | 2/2010 | Yakshin et al. | |
| 2012/0164354 A1 | 6/2012 | Otani et al. | |
| 2012/0322000 A1 | 12/2012 | Uno et al. | |
| 2013/0062610 A1 | 3/2013 | Clark et al. | |
| 2013/0209927 A1 | 8/2013 | Deweerd | |
| 2013/0323626 A1 | 12/2013 | Chang | |
| 2014/0007935 A1 | 1/2014 | Mutitu et al. | |
| 2015/0114835 A1 | 4/2015 | Gomi et al. | |
| 2015/0262797 A1 | 9/2015 | Ishihara et al. | |
| 2016/0011344 A1 | 1/2016 | Beasley et al. | |
| 2016/0161839 A1 | 6/2016 | Lu et al. | |
| 2017/0053784 A1 | 2/2017 | Subramani et al. | |
| 2017/0115555 A1 | 4/2017 | Hofmann et al. | |
| 2017/0131637 A1 | 5/2017 | Hofmann et al. | |
| 2017/0178877 A1 | 6/2017 | Wang et al. | |

FOREIGN PATENT DOCUMENTS

| | | |
|---|---|---|
| JP | S4832781 A | 5/1973 |
| JP | H2159374 A | 6/1990 |
| JP | 200826093 A | 2/2008 |
| JP | 201586438 A | 5/2015 |
| KR | 20110120785 A | 11/2011 |

OTHER PUBLICATIONS

Non-Final Office Action in U.S. Appl. No. 16/801,621, dated Jun. 9, 2021, 24 pages.
PCT International Search Report, and Written Opinion in PCT/US2019/040682 dated Oct. 23, 2019, 13 pages.
PCT International Search Report and Written Opinion in PCT/US2020/028669 dated Aug. 7, 2020, 14 pages.
"Machine Translation of JP200826093 (A)".
"Machine Translation of JPH2159374 (A)".
"Machine Translation of JPS4832781 (A)".

*Primary Examiner* — Christopher G Young
(74) *Attorney, Agent, or Firm* — Servilla Whitney LLC

(57) ABSTRACT

Extreme ultraviolet (EUV) mask blanks, methods for their manufacture, and production systems therefor are disclosed. The method for forming an EUV mask blank comprises placing a substrate in a multi-cathode physical vapor deposition chamber, the chamber comprising at least three targets, a first molybdenum target adjacent a first side of a silicon target and a second molybdenum target adjacent a second side of the silicon target.

18 Claims, 6 Drawing Sheets

EXTREME ULTRAVIOLET MASK BLANK DEFECT REDUCTION

CROSS-REFERENCE TO RELATED APPLICATIONS

This application claims priority to U.S. Provisional Application No. 62/694,744, filed Jul. 6, 2018, the entire disclosure of which is hereby incorporated by reference herein.

TECHNICAL FIELD

The present disclosure relates generally to extreme ultraviolet lithography, and more particularly extreme ultraviolet mask blanks with an alloy absorber and methods of manufacture.

BACKGROUND

Extreme ultraviolet (EUV) lithography, also known as soft x-ray projection lithography, can be used for the manufacture of 0.0135 micron and smaller minimum feature size semiconductor devices. Extreme ultraviolet light, which is generally in the 5 to 100 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor substrate.

The lens elements and mask blanks of extreme ultraviolet lithography systems are coated with reflective multilayer coatings of materials such as molybdenum and silicon. Reflection values of approximately 65% per lens element, or mask blank, have been obtained by using substrates that are coated with multilayer coatings that strongly reflect light within an extremely narrow ultraviolet bandpass, for example, 12.5 to 14.5 nanometer bandpass for 13.5 nanometer ultraviolet light.

EUV blanks have a low tolerance for defects on the working area of the blank. Silicon and molybdenum deposition leads to unbalanced stress on the chamber, which eventually contributes to stress related defects. The goal is to have zero killer type defects (large defects) in the working area of a blank, as these defects are difficult to repair and have a functioning EUV mask. Thus, there is a need for EUV blanks with reduced defects generated by stress imbalance.

SUMMARY

One or more embodiments of the disclosure are directed to a method of manufacturing an extreme ultraviolet (EUV) mask blank. The method comprises placing a substrate in a multi-cathode physical vapor deposition chamber, the chamber comprising at least three targets, a first molybdenum target adjacent a first side of a silicon target and a second molybdenum target adjacent a second side of the silicon target. A first molybdenum layer is deposited on the substrate, the first molybdenum layer deposited from the first molybdenum target. A silicon layer is deposited on the first molybdenum layer, the silicon layer deposited from the silicon target. A second molybdenum layer is deposited on the silicon layer, the second molybdenum layer deposited from the second molybdenum target.

Additional embodiments of the disclosure are related to a process of manufacturing an extreme ultraviolet (EUV) mask blank. The process comprises forming a multilayer stack of reflective layers on a substrate by depositing a first molybdenum layer on the substrate, the first molybdenum layer deposited from a first molybdenum target adjacent to a first side of a silicon target; depositing a silicon layer on the first molybdenum layer; and depositing a second molybdenum layer on the silicon layer, the second molybdenum layer deposited from a second molybdenum target adjacent to a second side of the silicon target.

Further embodiments of the disclosure are directed to an extreme ultraviolet (EUV) mask blank product system comprising a substrate handling vacuum chamber for creating a vacuum; a substrate handling platform, in the vacuum, for transporting a substrate loaded in the substrate handling vacuum chamber; a rotating shield having at least one opening for accessing a target; and at least three targets, a first molybdenum target adjacent to a first side of a silicon target and a second molybdenum target adjacent to a second side of the silicon target.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that reacts with the substrate surface.

Those skilled in the art will understand that the use of ordinals such as "first" and "second" to describe process regions do not imply a specific location within the processing chamber, or order of exposure within the processing chamber.

As used in this specification and the appended claims, the term "substrate" refers to a surface, or portion of a surface, upon which a process acts. It will also be understood by those skilled in the art that reference to a substrate is to only a portion of the substrate, unless the context clearly indicates otherwise. Additionally, in some embodiments, reference to depositing on a substrate means both a bare substrate and a substrate with one or more films or features deposited or formed thereon.

Figure 1:
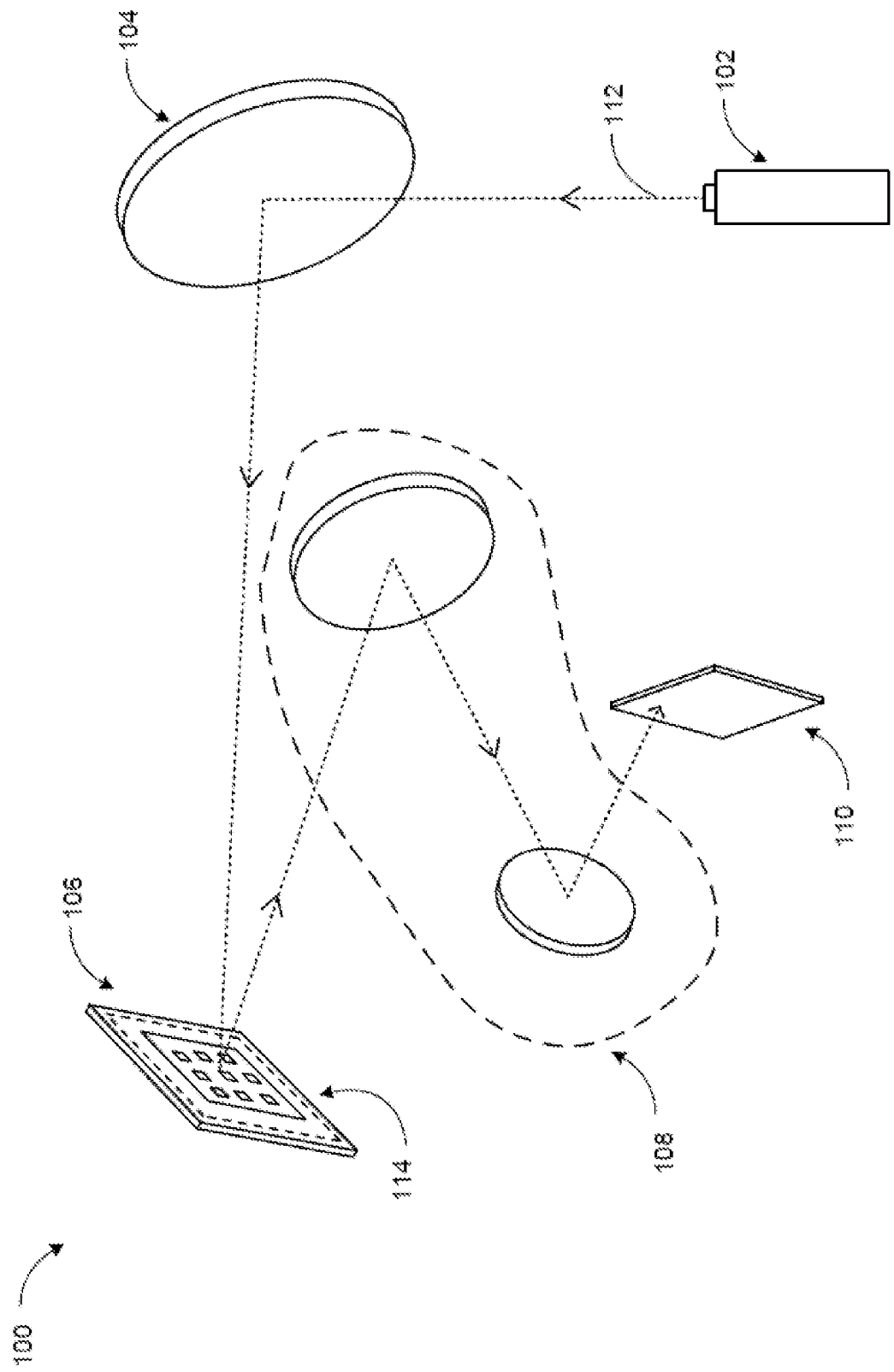
FIG. 1 schematically illustrates an embodiment of an extreme ultraviolet lithography system.

Referring now to FIG. 1, an exemplary embodiment of an extreme ultraviolet lithography system 100 is shown. The extreme ultraviolet lithography system 100 includes an extreme ultraviolet light source 102 for producing extreme ultraviolet light 112, a set of reflective elements, and a target wafer 110. The reflective elements include a condenser 104, an EUV reflective mask 106, an optical reduction assembly 108, a mask blank, a mirror, or a combination thereof.

The extreme ultraviolet light source 102 generates the extreme ultraviolet light 112. The extreme ultraviolet light 112 is electromagnetic radiation having a wavelength in a range of 5 to 50 nanometers (nm). For example, the extreme ultraviolet light source 102 includes a laser, a laser produced plasma, a discharge produced plasma, a free-electron laser, synchrotron radiation, or a combination thereof.

The extreme ultraviolet light source 102 generates the extreme ultraviolet light 112 having a variety of characteristics. The extreme ultraviolet light source 102 produces broadband extreme ultraviolet radiation over a range of wavelengths. For example, the extreme ultraviolet light source 102 generates the extreme ultraviolet light 112 having wavelengths ranging from 5 to 50 nm.

In one or more embodiments, the extreme ultraviolet light source 102 produces the extreme ultraviolet light 112 having a narrow bandwidth. For example, the extreme ultraviolet light source 102 generates the extreme ultraviolet light 112 at 13.5 nm. The center of the wavelength peak is 13.5 nm.

The condenser 104 is an optical unit for reflecting and focusing the extreme ultraviolet light 112. The condenser 104 reflects and concentrates the extreme ultraviolet light 112 from the extreme ultraviolet light source 102 to illuminate the EUV reflective mask 106.

Although the condenser 104 is shown as a single element, it is understood that the condenser 104 of some embodiments includes one or more reflective elements such as concave mirrors, convex mirrors, flat mirrors, or a combination thereof, for reflecting and concentrating the extreme ultraviolet light 112. For example, the condenser 104 of some embodiments is a single concave mirror or an optical assembly having convex, concave, and flat optical elements.

The EUV reflective mask 106 is an extreme ultraviolet reflective element having a mask pattern 114. The EUV reflective mask 106 creates a lithographic pattern to form a circuitry layout to be formed on the target wafer 110. The EUV reflective mask 106 reflects the extreme ultraviolet light 112. The mask pattern 114 defines a portion of a circuitry layout.

The optical reduction assembly 108 is an optical unit for reducing the image of the mask pattern 114. The reflection of the extreme ultraviolet light 112 from the EUV reflective mask 106 is reduced by the optical reduction assembly 108 and reflected on to the target wafer 110. The optical reduction assembly 108 of some embodiments includes mirrors and other optical elements to reduce the size of the image of the mask pattern 114. For example, the optical reduction assembly 108 of some embodiments includes concave mirrors for reflecting and focusing the extreme ultraviolet light 112.

The optical reduction assembly 108 reduces the size of the image of the mask pattern 114 on the target wafer 110. For example, the mask pattern 114 of some embodiments is imaged at a 4:1 ratio by the optical reduction assembly 108 on the target wafer 110 to form the circuitry represented by the mask pattern 114 on the target wafer 110. The extreme ultraviolet light 112 of some embodiments scans the reflective mask 106 synchronously with the target wafer 110 to form the mask pattern 114 on the target wafer 110.

Figure 2:
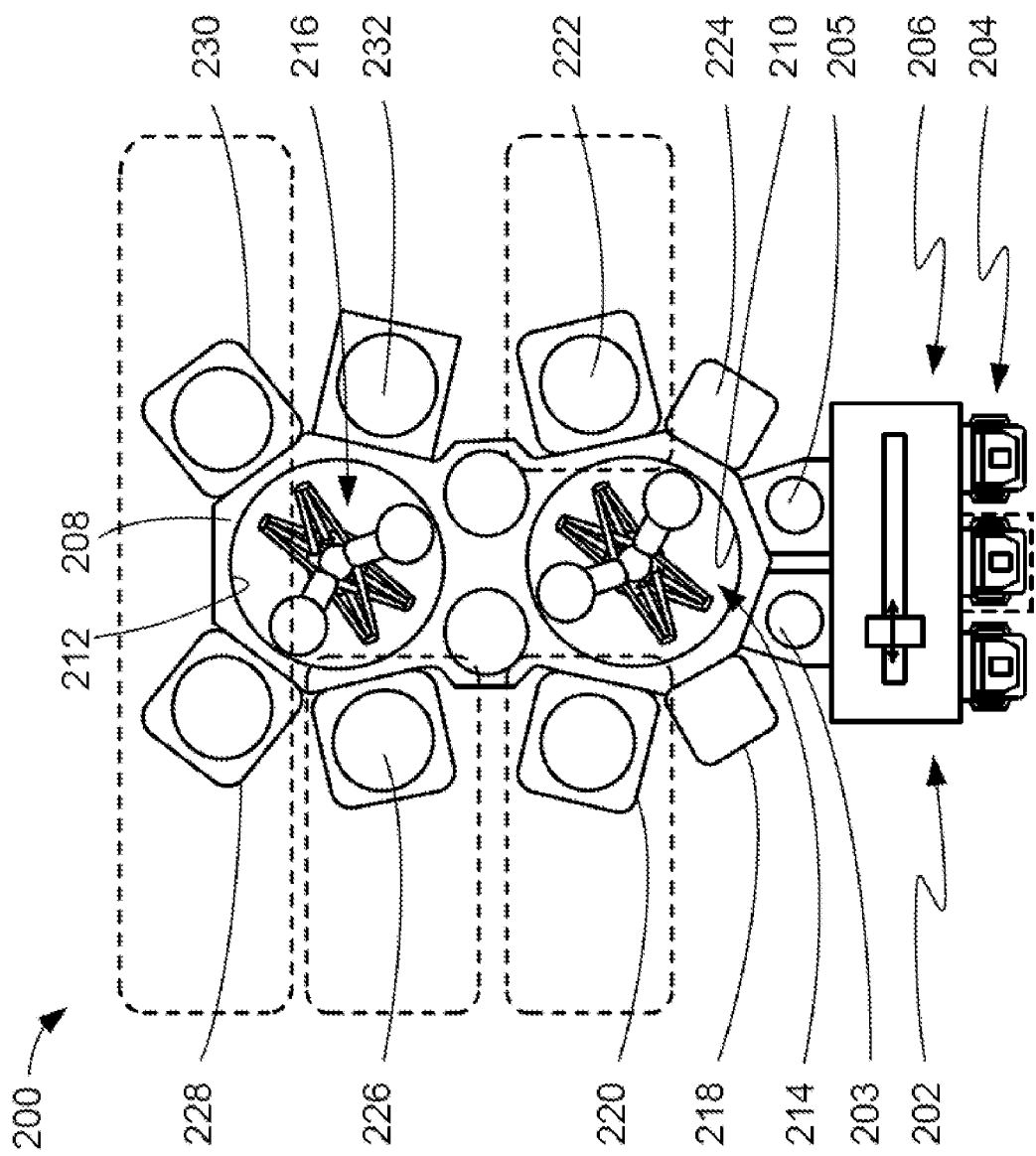
FIG. 2 illustrates an embodiment of an extreme ultraviolet reflective element production system.

Referring now to FIG. 2, an embodiment of an extreme ultraviolet reflective element production system 200 is shown. The extreme ultraviolet reflective element includes a EUV mask blank 204, an extreme ultraviolet (EUV) mirror 205, or other reflective element such as an EUV reflective mask 106.

The extreme ultraviolet reflective element production system 200 of some embodiments produces mask blanks, mirrors, or other elements that reflect the extreme ultraviolet light 112 of FIG. 1. The extreme ultraviolet reflective element production system 200 fabricates the reflective elements by applying thin coatings to source substrates 203.

The EUV mask blank 204 is a multilayered structure for forming the EUV reflective mask 106 of FIG. 1. The EUV mask blank 204 of some embodiments is formed using semiconductor fabrication techniques. The EUV reflective mask 106 of some embodiments has the mask pattern 114 of FIG. 1 formed on the mask blank 204 by etching and other processes.

The extreme ultraviolet mirror 205 is a multilayered structure reflective in a range of extreme ultraviolet light. The extreme ultraviolet mirror 205 of some embodiments is formed using semiconductor fabrication techniques. The EUV mask blank 204 and the extreme ultraviolet mirror 205 of some embodiments are similar structures with respect to the layers formed on each element, however, the extreme ultraviolet mirror 205 does not have the mask pattern 114.

The reflective elements are efficient reflectors of the extreme ultraviolet light 112. In an embodiment, the EUV mask blank 204 and the extreme ultraviolet mirror 205 has an extreme ultraviolet reflectivity of greater than 60%. The reflective elements are efficient if they reflect more than 60% of the extreme ultraviolet light 112.

The extreme ultraviolet reflective element production system 200 includes a wafer loading and carrier handling system 202 into which the source substrates 203 are loaded and from which the reflective elements are unloaded. An atmospheric handling system 206 provides access to a wafer handling vacuum chamber 208. The wafer loading and carrier handling system 202 of some embodiments includes substrate transport boxes, loadlocks, and other components to transfer a substrate from atmosphere to vacuum inside the system. Because the EUV mask blank 204 is used to form devices at a very small scale, the source substrates 203 and the EUV mask blank 204 are processed in a vacuum system to prevent contamination and other defects.

The wafer handling vacuum chamber 208 of some embodiments contains two vacuum chambers, a first vacuum chamber 210 and a second vacuum chamber 212. The first vacuum chamber 210 includes a first wafer handling system 214 and the second vacuum chamber 212 includes a second wafer handling system 216. Although the wafer handling vacuum chamber 208 is described with two vacuum chambers, it is understood that the system of some embodiments has any number of vacuum chambers.

The wafer handling vacuum chamber 208 of some embodiments has a plurality of ports around its periphery for attachment of various other systems. The first vacuum chamber 210 has a degas system 218, a first physical vapor deposition system 220, a second physical vapor deposition system 222, and a pre-clean system 224. The degas system 218 is for thermally desorbing moisture from the substrates. The pre-clean system 224 is for cleaning the surfaces of the wafers, mask blanks, mirrors, or other optical components.

The physical vapor deposition systems, such as the first physical vapor deposition system 220 and the second physical vapor deposition system 222, of some embodiments are used to form thin films of conductive materials on the source substrates 203. For example, the physical vapor deposition systems of some embodiments include vacuum deposition system such as magnetron sputtering systems, ion sputtering systems, pulsed laser deposition, cathode arc deposition, or a combination thereof. The physical vapor deposition systems, such as the magnetron sputtering system, form thin layers on the source substrates 203 including the layers of silicon, metals, alloys, compounds, or a combination thereof.

The physical vapor deposition system forms reflective layers, capping layers, and absorber layers. For example, the physical vapor deposition systems of some embodiments form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. Although some compounds are described as an oxide, it is understood that the compounds of some embodiments include oxides, dioxides, atomic mixtures having oxygen atoms, or a combination thereof.

The second vacuum chamber 212 has a first multi-cathode source 226, a chemical vapor deposition system 228, a cure chamber 230, and an ultra-smooth deposition chamber 232 connected to it. For example, the chemical vapor deposition system 228 of some embodiments includes a flowable chemical vapor deposition system (FCVD), a plasma assisted chemical vapor deposition system (CVD), an aerosol assisted CVD, a hot filament CVD system, or a similar system. In another example, the chemical vapor deposition system 228, the cure chamber 230, and the ultra-smooth deposition chamber 232 of some embodiments are in a separate system from the extreme ultraviolet reflective element production system 200.

The chemical vapor deposition system 228 of some embodiments forms thin films of material on the source substrates 203. For example, the chemical vapor deposition system 228 of some embodiments is used to form layers of materials on the source substrates 203 including monocrystalline layers, polycrystalline layers, amorphous layers, epitaxial layers, or a combination thereof. The chemical vapor deposition system 228 of some embodiments forms layers of silicon, silicon oxides, silicon oxycarbide, carbon, tungsten, silicon carbide, silicon nitride, titanium nitride, metals, alloys, and other materials suitable for chemical vapor deposition. For example, the chemical vapor deposition system of some embodiments forms planarization layers.

The first wafer handling system 214 is capable of moving the source substrates 203 between the atmospheric handling system 206 and the various systems around the periphery of the first vacuum chamber 210 in a continuous vacuum. The second wafer handling system 216 is capable of moving the source substrates 203 around the second vacuum chamber 212 while maintaining the source substrates 203 in a continuous vacuum. The extreme ultraviolet reflective element production system 200 of some embodiments transfers the source substrates 203 and the EUV mask blank 204 between the first wafer handling system 214 and the second wafer handling system 216 in a continuous vacuum.

In the following sections, the term for the EUV mask blank 204 is used interchangeably with the term of the extreme ultraviolet mirror 205 for simplicity.

The EUV mask blank 204 is an optically flat structure used for forming the reflective mask 106 having the mask pattern 114. In one or more embodiments, the reflective surface of the EUV mask blank 204 forms a flat focal plane for reflecting the incident light, such as the extreme ultraviolet light 112 of FIG. 1.

Figure 3:
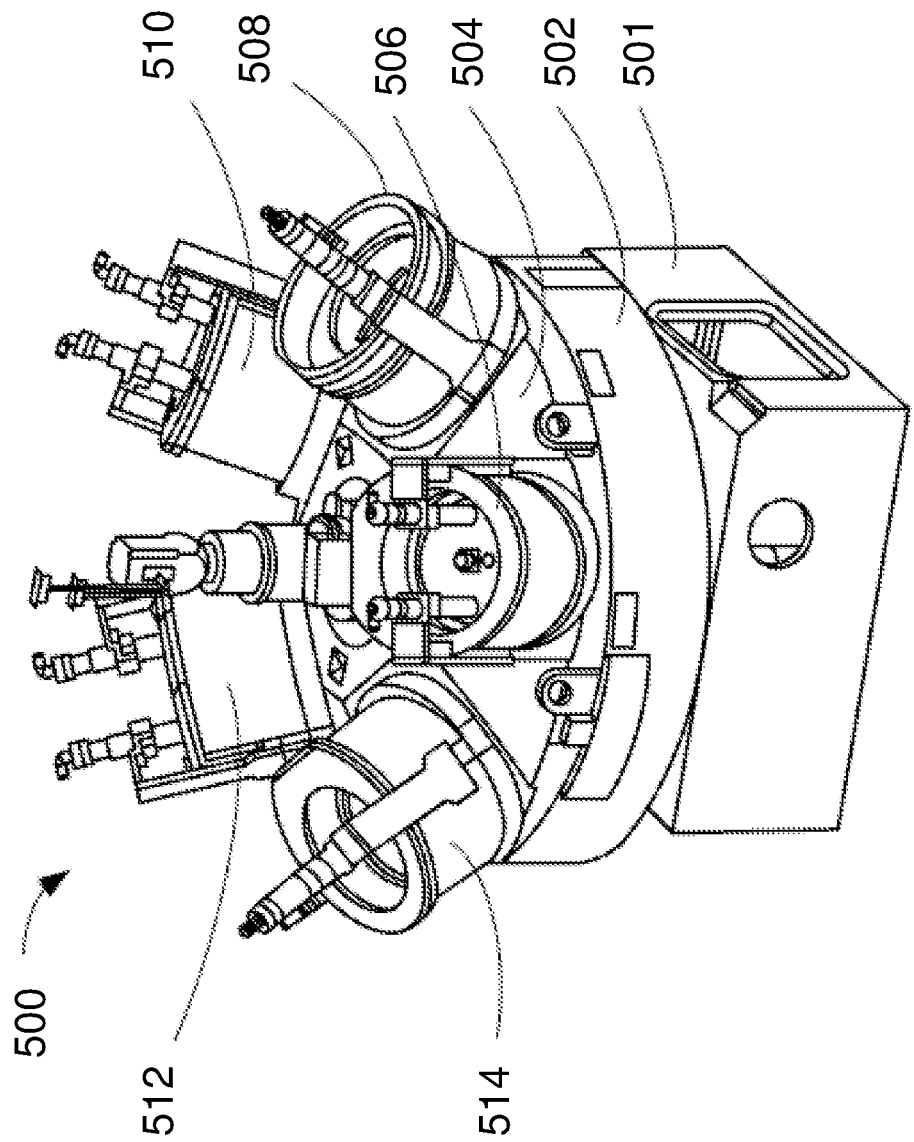
FIG. 3 illustrates an embodiment of a multi-cathode physical deposition chamber.

Referring now to FIG. 3, an upper portion of a multi-cathode source chamber 500 is shown in accordance with an embodiment. The first multi-cathode chamber 500 includes a base structure 501 with a cylindrical body portion 502 capped by a top adapter 504. The top adapter 504 has provisions for a number of cathode sources, such as cathode sources 506, 508, 510, 512, and 514, positioned around the top adapter 204.

The multi-cathode source chamber 500 of some embodiments is part of the system shown in FIG. 2. In an embodiment, an extreme ultraviolet (EUV) mask blank production system comprises a substrate handling vacuum chamber for creating a vacuum, a substrate handling platform, in the vacuum, for transporting a substrate loaded in the substrate handling vacuum chamber, a rotating shield having at least one opening for accessing a target, and at least three targets, a first molybdenum target adjacent to a first side of a silicon target and a second molybdenum target adjacent to a second side of the silicon target, for forming an EUV mask blank, including a multilayer stack of reflective layers on the substrate, the multilayer stack including a plurality of reflective layer pairs, and a capping layer on the multilayer stack reflective layers. As used herein, the term "adjacent" refers to the placement of the first molybdenum target immediately next to one side of the silicon target and the second molybdenum target immediately next to the silicon target on a side opposite the one side.

In some embodiments, the first side of the silicon target and the second side of the silicon target are substantially opposite one another. As used herein, the term "substantially opposite" means that there is a line bisecting the silicon target and the first molybdenum target is on a first end of the bisecting line and the second molybdenum target is on a second end of the bisecting line. The silicon target is therefore bounded on two opposite sides by a molybdenum target.

Typically, in a multi-cathode (MC) chamber, the target is exposed to the MC chamber through a rotating shield. The shield first moves to a silicon target for deposition, followed by rotating to a molybdenum target. This means that the rotating shield will be exposed to molybdenum or silicon target depositions from the same opening (or hole) in the rotating shield, therefore, providing relatively uniform deposition on the rotating shield compared to the rest of the process kit. The lower process kit (i.e., extension shield, conical shield, cover ring, dep-ring and puck), however, will see non-symmetric deposition. There will be regions, therefore, of the lower process kit that will see pure silicon deposition (silicon-rich areas) and some portions that will see pure molybdenum deposition.

In one or more embodiments, depositing from two molybdenum targets that are on opposite sides of a silicon target is used to mitigate the build-up of compressive stress in silicon-rich regions to prevent flaking. As used herein according to one or more embodiments, the alternating deposition of silicon and molybdenum such that the silicon forms the shape of a butterfly body and the molybdenum is deposited as butterfly wings on either side of the silicon is referred to by the phrase the term "butterfly pasting." Without intending to be bound by theory, it is thought that the deposited molybdenum pastes down the deposited silicon (i.e. the molybdenum is depositing on top of the silicon and holding the silicon in place), thus preventing the silicon from flaking. Butterfly pasting allows mitigation of sources of large size defects in a chamber with a relatively small volume. Accordingly, in order to mitigate stress build up in silicon-rich areas, molybdenum deposition is spread onto those silicon-rich regions of the lower process kit by deposition using two, instead of one, molybdenum targets. The silicon target is advantageously surrounded by two molybdenum targets on opposite sides of the silicon target. While a silicon plume spreads out as a larger volume onto the lower components of the process chamber, the molybdenum plume is more directional, having a relatively smaller volume than the silicon plume. Hence, according to one or more embodiments, if there are two molybdenum targets on either side of a silicon target, the net summation of the two molybdenum plumes beneficially cover more of the silicon plume than can a single molybdenum target. More molybdenum is, therefore, according to one or more embodiments, deposited on silicon-rich regions, thereby lowering the net stress of the deposited film on the process kit, which in turn lowers the possibility of flaking of silicon.

One or more embodiments provides a method of manufacturing an extreme ultraviolet (EUV) mask blank having reduced defects, reduced stress, and lower levels of silicon flaking when compared to extreme ultraviolet mask blanks prepared according to traditional methods. In an embodiment, the multilayer stack of reflective layers has a total silicon flake measurement of less than about 25 eDR using an eDR 5200 from KLA Tencor.

In one or more embodiments, a method of manufacturing an extreme ultraviolet (EUV) mask blank comprises placing a substrate in a multi-cathode (MC) physical vapor deposition (PVD) chamber, the chamber comprising at least three targets, a first molybdenum target adjacent a first side of a silicon target and a second molybdenum target adjacent a second side of the silicon target. A first molybdenum layer is deposited on the substrate, the first molybdenum layer deposited from the first molybdenum target. A silicon layer is deposited on the first molybdenum layer, the silicon layer deposited from the silicon target. A second molybdenum layer is deposited on the silicon layer, the second molybdenum layer deposited from the second molybdenum target.

In some embodiments, the at least three targets are arranged such that a silicon target is in the middle of a first molybdenum target and a second molybdenum target. The first molybdenum target is located on a first side of the silicon target, and the second molybdenum target is located on a second side of the silicon target. The first side of the silicon target and the second side of the silicon target may be substantially opposite one another. As used herein, the term "substantially opposite" means that there is a line bisecting the silicon target and the first molybdenum target is on a first end of the bisecting line and the second molybdenum target is on a second end of the bisecting line. In some embodiments, the first molybdenum layer has a thickness in a range of about 1 nm to about 10 nm. In a specific embodiment, the first molybdenum layer has a thickness of about 2.8 nm. The second molybdenum layer may have a thickness in a range of about 1 nm to about 10 nm. In a specific embodiment, the second molybdenum layer has a thickness of about 2.8 nm. The silicon layer may have a thickness in a range of about 1 nm to about 10 nm. In a specific embodiment, the silicon layer has a thickness of about 4.1 nm.

Figure 4B:
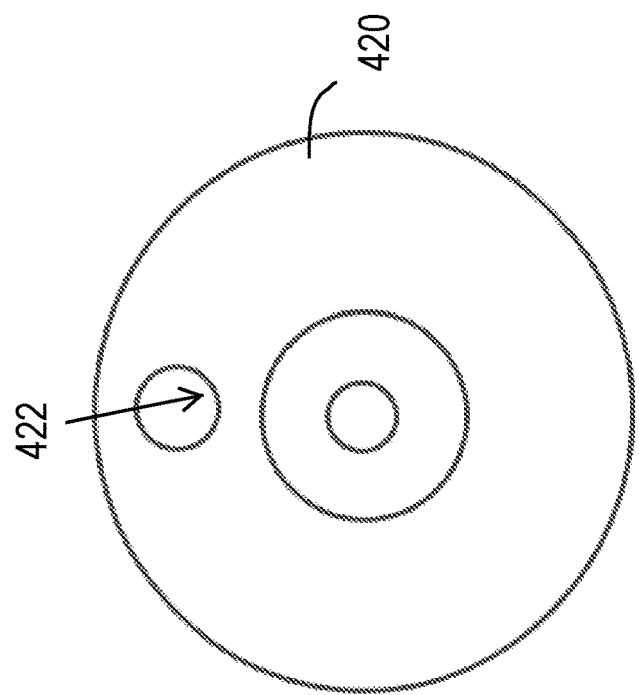
FIGS. 4A-4B illustrate components of a multi-cathode physical deposition chamber according to an embodiment.
Figure 4A:
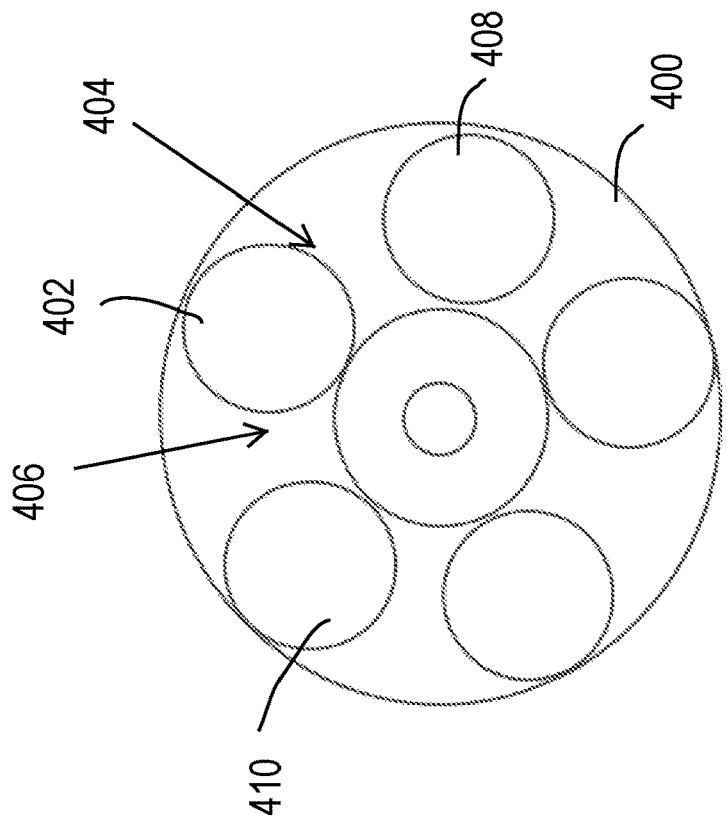

High reflecting EUV blanks are made by magnetron sputtering of molybdenum (Mo) and silicon (Si). It is known that silicon and molybdenum deposited through sputtering, have compressive and tensile stress. Referring to FIGS. 4A-4B, a multi-cathode (MC) chamber includes an upper process kit 400, a rotating shield 420, and a non-rotating, lower process kit 430. The upper process kit 400 has at least three targets: a silicon target 402 with a first side 404 and a second side 406, a first molybdenum target 408 located on the first side 404 of the silicon target 402, and a second molybdenum target 410 located on the second side 406 of the silicon target 402. The rotating shield 420 has at least one opening 422 to be positioned to permit sequential deposition from one of the first molybdenum target, the silicon target, or the second molybdenum target. When the rotating shield 420 is rotated, a target is exposed. The target is selected from one or more of the first molybdenum target, the silicon target, or the second molybdenum target. More specifically, when the rotating shield 420 rotates, the at least one opening 422 aligns with a target on the upper process kit 400 and the material (e.g. silicon or molybdenum) located in the target is released and deposited on a substrate in the MC chamber. The non-rotating, lower process kit 440 holds the substrate (not shown) for deposition of the reflective layers.

In one or more embodiment, the rotating shield 420 first moves the opening in the target to the first molybdenum target 408 to permit deposition of molybdenum from the first molybdenum target through the opening, followed by rotating the opening to the silicon target 402 to permit deposition from the silicon target through the opening, then rotating the opening to the second molybdenum target 410 to permit deposition from the second molybdenum target through the opening. The first molybdenum target 408 and the second molybdenum target 410 are located substantially opposite each other on the rotating shield on opposite sides of the silicon target 402. The rotating shield 420 allows deposition from the molybdenum targets or the silicon target through the same at least one opening 422 (or hole) in the rotating shield 420, therefore, providing relatively uniform deposition on the rotating shield 420 compared to the rest of the process kit.

Figure 5:
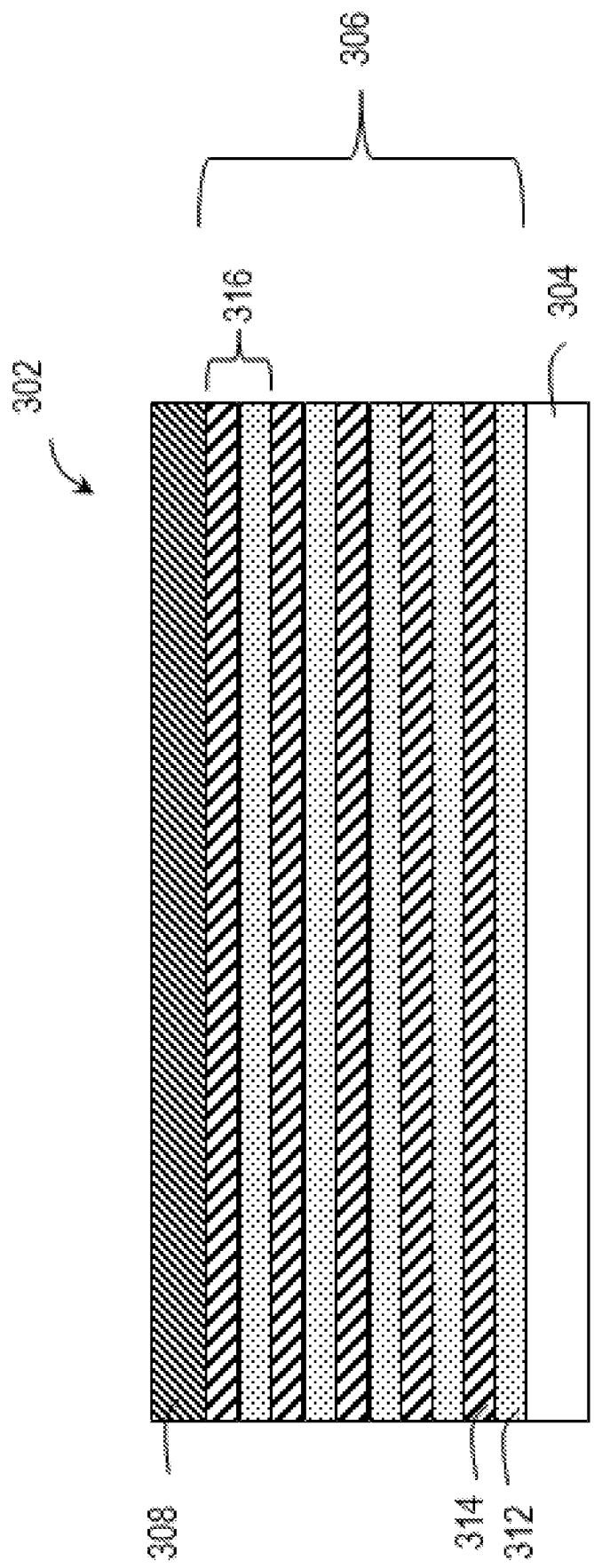
FIG. 5 illustrates an embodiment of an extreme ultraviolet reflective element such as an EUV mask blank.

Referring now to FIG. 5, an embodiment of an extreme ultraviolet reflective element 302 is shown. In one or more embodiments, the extreme ultraviolet reflective element 302 is the EUV mask blank 204 of FIG. 2 or the extreme ultraviolet mirror 205 of FIG. 2. The EUV mask blank 204 and the extreme ultraviolet mirror 205 are structures for reflecting the extreme ultraviolet light 112 of FIG. 1. The EUV mask blank 204 is used to form the EUV reflective mask 106 shown in FIG. 1.

The extreme ultraviolet reflective element 302 includes a substrate 304, a multilayer stack 306 of reflective layers, and a capping layer 308. In one or more embodiments, the extreme ultraviolet mirror 205 is used to form reflecting structures for use in the condenser 104 of FIG. 1 or the optical reduction assembly 108 of FIG. 1.

The extreme ultraviolet reflective element 302, which in some embodiments is an EUV mask blank 204, includes the substrate 304, the multilayer stack 306 of reflective layers comprising alternating layers of silicon and molybdenum, and an optional capping layer 308. The extreme ultraviolet reflective element 302 in some embodiments is a EUV mask blank 204, which is used to form the reflective mask 106 of FIG. 1 by patterning. In the following sections, the term for the EUV mask blank 204 is used interchangeably with the term of the extreme ultraviolet mirror 205 for simplicity.

The EUV mask blank 204 is an optically flat structure used for forming the reflective mask 106 having the mask pattern 114. In one or more embodiments, the reflective surface of the EUV mask blank 204 forms a flat focal plane for reflecting the incident light, such as the extreme ultraviolet light 112 of FIG. 1.

The substrate 304 is an element for providing structural support to the extreme ultraviolet reflective element 302. In one or more embodiments, the substrate 304 is made from a material having a low coefficient of thermal expansion (CTE) to provide stability during temperature changes. In one or more embodiments, the substrate 304 has properties such as stability against mechanical cycling, thermal cycling, crystal formation, or a combination thereof. The substrate 304 according to one or more embodiments is formed from a material such as silicon, glass, oxides, ceramics, glass ceramics, or a combination thereof.

The multilayer stack 306 is a structure that is reflective to the extreme ultraviolet light 112. The multilayer stack 306 includes alternating reflective layers of a first reflective layer 312 and a second reflective layer 314.

The first reflective layer 312 and the second reflective layer 314 form a reflective pair 316 of FIG. 5. In a non-limiting embodiment, the multilayer stack 306 includes a range of 20-60 of the reflective pairs 316 for a total of up to 120 reflective layers.

The first reflective layer 312 and the second reflective layer 314 according to one or more embodiments are formed from a variety of materials. In an embodiment, the first reflective layer 312 and the second reflective layer 314 are formed from silicon and molybdenum, respectively.

The first reflective layer 312 and the second reflective layer 314 of some embodiments have a variety of structures. In an embodiment, both the first reflective layer 312 and the second reflective layer 314 are formed with a single layer, multiple layers, a divided layer structure, non-uniform structures, or a combination thereof. Because most materials absorb light at extreme ultraviolet wavelengths, the optical elements used are reflective instead of the transmissive, as used in other lithography systems. The multilayer stack 306 forms a reflective structure by having alternating thin layers of materials with different optical properties to create a Bragg reflector or mirror.

In an embodiment, each of the alternating layers has dissimilar optical constants for the extreme ultraviolet light 112. The alternating layers provide a resonant reflectivity when the period of the thickness of the alternating layers is one half the wavelength of the extreme ultraviolet light 112. In an embodiment, for the extreme ultraviolet light 112 at a wavelength of 13 nm, the alternating layers are about 6.5 nm thick. It is understood that the sizes and dimensions provided are within normal engineering tolerances for typical elements.

The multilayer stack 306 according to one or more embodiments is formed in a variety of ways. In an embodiment, the first reflective layer 312 and the second reflective layer 314 are formed with magnetron sputtering, ion sputtering systems, pulsed laser deposition, cathode arc deposition, or a combination thereof.

In an illustrative embodiment, the multilayer stack 306 is formed using a physical vapor deposition technique, such as magnetron sputtering. In an embodiment, the first reflective layer 312 and the second reflective layer 314 of the multilayer stack 306 have the characteristics of being formed by the magnetron sputtering technique including precise thickness, low roughness, and clean interfaces between the layers. In an embodiment, the first reflective layer 312 and the second reflective layer 314 of the multilayer stack 306 have the characteristics of being formed by the physical vapor deposition including precise thickness, low roughness, and clean interfaces between the layers.

The physical dimensions of the layers of the multilayer stack 306 formed using the physical vapor deposition technique is precisely controlled to increase reflectivity. In an embodiment, the first reflective layer 312, such as a layer of silicon, has a thickness of 4.1 nm. The second reflective layer 314, such as a layer of molybdenum, has a thickness of 2.8 nm. The thickness of the layers dictates the peak reflectivity wavelength of the extreme ultraviolet reflective element. If the thickness of the layers is incorrect, the reflectivity at the desired wavelength 13.5 nm of some embodiments reduced.

In one or more embodiments, the capping layer 308 is a protective layer allowing the transmission of the extreme ultraviolet light 112. In an embodiment, the capping layer 308 is formed directly on the multilayer stack 306. In one or more embodiments, the capping layer 308 protects the multilayer stack 306 from contaminants and mechanical damage. In one embodiment, the multilayer stack 306 is sensitive to contamination by oxygen, carbon, hydrocarbons, or a combination thereof. The capping layer 308 according to an embodiment interacts with the contaminants to neutralize them.

Continuous deposition of silicon onto a chamber body of some embodiments increases the compressive stress build up on the process kit, which results in large amounts of flaking. In such cases, exponential large size particles are observed, increasing with extended continuous deposition. When the butterfly pasting method according to one or more embodiments is employed, similar thicknesses of silicon deposited in the chamber with molybdenum deposition after every silicon layer deposition shows an order of magnitude lower in large size particles, indicating that molybdenum is used as an effective stress relaxing pasting material.

Figure 6:
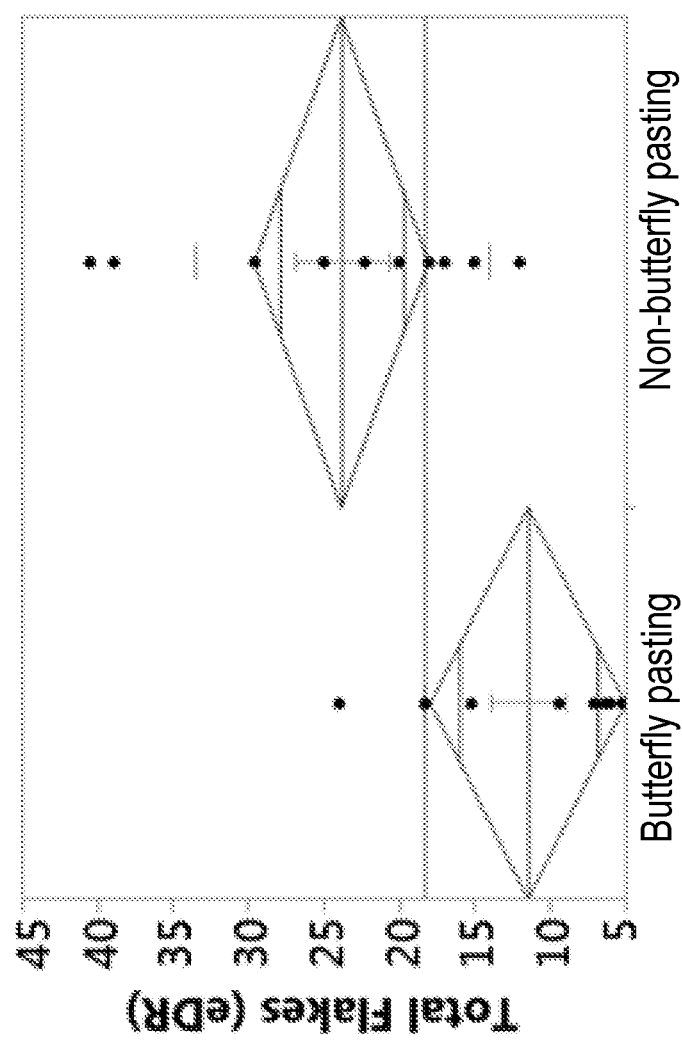
FIG. 6 is a graph of the total flaking for a method according to an embodiment.

Referring to FIG. 6, when two different runs on a multi-cathode chamber configuration are compared (with and without butterfly pasting), a significant improvement in the total defects and, more specifically, in the total number of failures as recorded by flakes is observed.

In one or more embodiments, a process of manufacturing an extreme ultraviolet (EUV) mask blank is provided. The process comprises forming a multilayer stack of reflective layers on a substrate by depositing a first molybdenum layer on the substrate, the first molybdenum layer deposited from a first molybdenum target adjacent to a first side of a silicon target; depositing a silicon layer on the first molybdenum layer; and depositing a second molybdenum layer on the silicon layer, the second molybdenum layer deposited from a second molybdenum target adjacent to a second side of the silicon target.

In some embodiments, the first molybdenum layer has a thickness in a range of about 1 nm to about 10 nm. In a specific embodiment, the first molybdenum layer has a thickness of about 2.8 nm. The second molybdenum layer may have a thickness in a range of about 1 nm to about 10 nm. In a specific embodiment, the second molybdenum layer has a thickness of about 2.8 nm. The silicon layer may have a thickness in a range of about 1 nm to about 10 nm. In a specific embodiment, the silicon layer has a thickness of about 4.1 nm.

In an embodiment, the deposition of the first molybdenum layer, the silicon layer, and second molybdenum layer are repeated to form a multilayer stack of reflective layers comprising alternating layers of molybdenum and silicon.

In an embodiment, a capping layer is deposited on the multilayer stack of reflective layers. The capping layer comprises any capping material know to one of skill in the art.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing an extreme ultraviolet (EUV) mask blank, the method comprising:
    placing a substrate in a multi-cathode physical vapor deposition chamber, the chamber comprising at least three targets, a first molybdenum target adjacent a first side of a silicon target and a second molybdenum target adjacent a second side of the silicon target;
    depositing a first molybdenum layer on the substrate, the first molybdenum layer deposited from the first molybdenum target;
    depositing a silicon layer on the first molybdenum layer, the silicon layer deposited from the silicon target; and
    depositing a second molybdenum layer on the silicon layer, the second molybdenum layer deposited from the second molybdenum target.

2. The method of claim 1, wherein the first molybdenum layer has a thickness in a range of about 1 nm to about 10 nm.

3. The method of claim 1, wherein the second molybdenum layer has a thickness in a range of about 1 nm to about 10 nm.

4. The method of claim 1, wherein the silicon layer has a thickness in a range of about 1 nm to about 10 nm.

5. The method of claim 1, wherein the multi-cathode physical vapor deposition chamber further comprises a rotating shield.

6. The method of claim 5, wherein the rotating shield comprises at least one opening configured to be positioned to permit sequential deposition from of the first molybdenum target, the silicon target, or the second molybdenum target.

7. The method of claim 6, further comprising rotating the rotating shield and accessing a target selected from one or more of the first molybdenum target, the silicon target, or the second molybdenum target.

8. The method of claim 7, further comprising repeating rotating the rotating shield and the accessing of the target to form a multilayer stack of reflective layers comprising alternating layers of molybdenum and silicon.

9. The method of claim 8, wherein the multilayer stack of reflective layers has a total silicon flake measurement of less than about 25 eDR.

10. The method of claim 1, wherein the first side of the silicon target and the second side of the silicon target are substantially opposite one another.

11. The method of claim 8, further comprising depositing a capping layer on the multilayer stack of reflective layers.

12. A process of manufacturing an extreme ultraviolet (EUV) mask blank, the process comprising:
    forming a multilayer stack of reflective layers on a substrate by
    depositing a first molybdenum layer on the substrate, the first molybdenum layer deposited from a first molybdenum target adjacent to a first side of a silicon target;
    depositing a silicon layer on the first molybdenum layer; and
    depositing a second molybdenum layer on the silicon layer, the second molybdenum layer deposited from a second molybdenum target adjacent to a second side of the silicon target.

13. The process of claim 12, wherein the first molybdenum layer has a thickness in a range of about 1 nm to about 10 nm.

14. The process of claim 12, wherein the second molybdenum layer has a thickness in a range of about 1 nm to about 10 nm.

15. The process of claim 12, wherein the silicon layer has a thickness in a range of about 1 nm to about 10 nm.

16. The process of claim 12, further comprising repeating depositing of the first molybdenum layer, the silicon layer, and the second molybdenum layer to form a multilayer stack comprising alternating layers of molybdenum and silicon.

17. The process of claim 12, wherein the first side of the silicon target and the second side of the silicon target are substantially opposite one another.

18. The process of claim 12, further comprising depositing a capping layer on the multilayer stack of reflective layers.

* * * * *